United States Patent
Park et al.

(10) Patent No.: US 9,870,732 B2
(45) Date of Patent: Jan. 16, 2018

(54) ORGANIC LIGHT EMITTING DISPLAY APPARATUS USING DITHERING AND METHOD OF DRIVING THE SAME

(71) Applicant: SAMSUNG DISPLAY CO., LTD., Yongin-si, Gyeonggi-Do (KR)

(72) Inventors: Seungho Park, Yongin-si (KR); Baekwoon Lee, Yongin-si (KR)

(73) Assignee: SAMSUNG DISPLAY CO., LTD., Yongin-Si, Gyeonggi-do (KR)

( * ) Notice: Subject to any disclaimer, the term of this patent is extended or adjusted under 35 U.S.C. 154(b) by 81 days.

(21) Appl. No.: 14/922,357

(22) Filed: Oct. 26, 2015

(65) Prior Publication Data

US 2016/0171921 A1    Jun. 16, 2016

(30) Foreign Application Priority Data

Dec. 12, 2014  (KR) ........................ 10-2014-0179367

(51) Int. Cl.
  G09G 5/02      (2006.01)
  G09G 3/3208    (2016.01)
  G09G 3/20      (2006.01)

(52) U.S. Cl.
  CPC ......... *G09G 3/3208* (2013.01); *G09G 3/2055* (2013.01); *G09G 2320/0233* (2013.01); *G09G 2320/0247* (2013.01)

(58) Field of Classification Search
  CPC .. G09G 3/2044; G09G 3/3225; G09G 3/2055; G09G 3/3208
  USPC ......................................................... 345/596
  See application file for complete search history.

(56) References Cited

U.S. PATENT DOCUMENTS

| | | | |
|---|---|---|---|
| 2005/0259046 A1 | 11/2005 | Lee et al. | |
| 2006/0092172 A1* | 5/2006 | Tung | G09G 3/2055 345/596 |
| 2008/0211759 A1* | 9/2008 | Holmes | G09G 3/2044 345/89 |
| 2008/0225054 A1* | 9/2008 | Kim | G09G 3/2051 345/599 |
| 2008/0309602 A1* | 12/2008 | Hwang | G09G 3/006 345/89 |
| 2009/0303227 A1* | 12/2009 | Hwang | G09G 3/2055 345/214 |
| 2010/0060660 A1* | 3/2010 | Bae | G09G 3/2055 345/596 |

(Continued)

FOREIGN PATENT DOCUMENTS

KR  10-2005-0082118 A  8/2005
KR  10-2005-0111271 A  11/2005

(Continued)

*Primary Examiner* — Adam J Snyder
(74) *Attorney, Agent, or Firm* — Lee & Morse P.C.

(57) ABSTRACT

An organic light emitting display apparatus includes a first data line, a comparator, and a data generator. The first data line is connected to a first pixel. The comparator compares first image data of input image data to at least one of a first critical grayscale value or a second critical grayscale value, where the first image data corresponds to the first pixel. The data generator determines the first critical grayscale value or the second critical grayscale value as first corrected image data when the first image data is equal to or greater than the first critical grayscale value but lower than the second critical grayscale value.

20 Claims, 8 Drawing Sheets

(56) References Cited

U.S. PATENT DOCUMENTS

2012/0133668 A1\* 5/2012 Harada ................ G09G 3/2055
                                                         345/589
2014/0146090 A1   5/2014 Oh et al.
2015/0062150 A1\* 3/2015 Small ................... G09G 3/2011
                                                         345/599
2015/0379931 A1\* 12/2015 Kato .................... G09G 3/3233
                                                         345/77

FOREIGN PATENT DOCUMENTS

KR   10-2013-0077044 A   7/2013
KR   10-2014-0051198 A   4/2014
KR   10-2014-0066339 A   6/2014

\* cited by examiner

ORGANIC LIGHT EMITTING DISPLAY APPARATUS USING DITHERING AND METHOD OF DRIVING THE SAME

CROSS-REFERENCE TO RELATED APPLICATION

Korean Patent Application No. 10-2014-0179367, filed on Dec. 12, 2014, and entitled, "Organic Light Emitting Display Apparatus and Method Of Driving The Same," is incorporated by reference herein in its entirety.

BACKGROUND

1. Field

One or more embodiments described herein relate to an organic light emitting display apparatus and a method for driving an organic light emitting display apparatus.

2. Description of the Related Art

Various types of flat panel displays have been developed. Examples include liquid crystal displays, field emission displays, plasma displays, and organic light emitting displays. Organic light emitting displays are lighter and thinner than other types of displays and tend to have a wider viewing angle, faster response times, and lower power consumption.

In an organic light emitting display, images are generated based on light emitted from organic light emitting diodes. Each diode emits light based on the recombination of electrons and holes in an emission layer. The amount of light emitted varies based on an applied current. When a low grayscale image is displayed, low grayscale stains may form because it is difficult to finely control the current driving the diodes. This may be attributed, at least in part, by the sensitivity of the diodes in the low grayscale range.

SUMMARY

In accordance with one or more embodiments, an organic light emitting display apparatus includes a display including a first data line connected to a first pixel; a comparator to compare first image data of input image data to at least one of a first critical grayscale value or a second critical grayscale value, the first image data corresponding to the first pixel; a data generator to determine one of the first critical grayscale value or the second critical grayscale value as first corrected image data when the first image data is equal to or greater than the first critical grayscale value but lower than the second critical grayscale value; a source driver to output a data signal corresponding to input data to the first data line; and an output to output the first corrected image data to the source driver.

The first image data may range between a lower grayscale value and an upper grayscale value, and when the first image data is equal to or greater than the lower grayscale value but lower than the first critical grayscale value, or the first image data ranges between the second critical grayscale value and the upper grayscale value, the data generator may determine the first image data as the first corrected image data.

The apparatus may include a position determiner to determine a position of the first pixel of the display, wherein, when the first image data is equal to or greater than the first critical grayscale value but lower than the second critical grayscale value, the data generator is to determine one of the first critical grayscale value or the second critical grayscale value as the first corrected image data based on a dithering algorithm and the determined position of the first pixel.

The position determiner may determine the position of the first pixel as one of a first position or a second position, when the first image data is equal to or greater than the first critical grayscale value but lower than the second critical grayscale value and the position of the first pixel is the first position, the data generator may determine the second critical grayscale value as the first corrected image data, and when the first image data is equal to or greater than the first critical grayscale value but lower than the second critical grayscale value and the position of the first pixel is the second position, the data generator determines the first critical grayscale value as the first corrected image data.

The position determiner may store a plurality of dithering patterns, each of the dithering patterns having data elements, each of the data elements having a first value or a second value, select one of the dithering patterns corresponding to the first image data, select one of the data elements of the selected dithering pattern corresponding to the position of the first pixel, determine the position of the first pixel as the first position when the selected data element has the first value, and determine the position of the first pixel as the second position when the selected data element has the second value.

The apparatus may include an order determiner to determine an order of an image frame including the input image data, wherein: when the first image data is equal to or greater than the first critical grayscale value but lower than the second critical grayscale value, the data generator may determine one of the first critical grayscale value or the second critical grayscale value as the first corrected image data based on a dithering algorithm, the determined order of the image frame, and the determined position of the first pixel.

The position determiner may determine the position of the first pixel as one of a first position or a second position based on the determined order of the image frame, when the first image data is equal to or greater than the first critical grayscale value but lower than the second critical grayscale value and the position of the first pixel is the first position, the data generator may determine the second critical grayscale value as the first corrected image data, and when the first image data is equal to or greater than the first critical grayscale value but lower than the second critical grayscale value and the position of the first pixel is the second position, the data generator may determine the first critical grayscale value as the first corrected image data.

When the order of the image frame including the input image data is an odd number, the order determiner may determine the order of the image frame as a first turn. When the order of the image frame including the input image data is an even number, the order determiner may determine the order of the image frame as a second turn. The position determiner may store first and second pattern sets, each of the first and second pattern sets includes a plurality of dithering patterns, each of the dithering patterns including data elements, each data element having a first value or a second value. The position determiner may select the first pattern set when the order of the image frame is the first turn or the second pattern set when the order of the image frame is the second turn, select one of the dithering patterns of the selected pattern set that corresponds to the first image data, select one of the data elements of the selected dithering pattern that corresponds to the position of the first pixel, determine the position of the first pixel as the first position when the selected data element has the first value, and determine the position of the first pixel as the second position when the selected data element has the second value.

The comparator may compare the first image data with the first critical grayscale value to an n-th critical grayscale value, and when the first image data is equal to or greater than a k-th critical grayscale value but lower than a (k+1)-th critical grayscale value, the data generator may determine one of the k-th critical grayscale value or the (k+1)-th critical grayscale value as the first corrected image data, where n is an integer equal to or greater than 2 and k is an integer ranging between 1 and (n−1).

The first image data may range between a lower grayscale value and a upper grayscale value, and when the first image data is equal to or greater than the lower grayscale value but lower than the first critical grayscale value, or the first image data ranges between the n-th critical grayscale value and the upper grayscale value, the data generator may determine the first image data as the first corrected image data.

The apparatus may include a position determiner to determine a position of the first pixel on the display, wherein: when the first image data is equal to or greater than the k-th critical grayscale value but lower than the (k+1)-th critical grayscale value, the data generator may determine one of the k-th critical grayscale value or the (k+1)-th critical grayscale value as the first corrected image data based on a dithering algorithm and the determined position of the first pixel.

The position determiner may determine the position of the first pixel as one of a first position or a second position, when the first image data is equal to or greater than the k-th critical grayscale value but lower than the (k+1)-th critical grayscale value and the position of the first pixel is the first position, the data generator determine the (k+1)-th critical grayscale value as the first corrected image data, and when the first image data is equal to or greater than the k-th critical grayscale value but lower than the (k+1)-th critical grayscale value and the position of the first pixel is the second position, the data generator may determine the k-th critical grayscale value as the first corrected image data.

The apparatus may include an order determiner to determine an order of an image frame including the input image data, wherein: when the first image data is equal to or greater than the k-th critical grayscale value but lower than the (k+1)-th critical grayscale value, the data generator may determine the k-th critical grayscale value or the (k+1)-th critical grayscale value as the first corrected image data based on a dithering algorithm, the determined order of the image frame, and the determined position of the first pixel.

The position determiner may determine the position of the first pixel as one of a first position or a second position based on the determined order of the image frame, when the first image data is equal to or greater than the k-th critical grayscale value but lower than the (k+1)-th critical grayscale value and the position of the first pixel is the first position, the data generator may determine the (k+1)-th critical grayscale value as the first corrected image data, and when the first image data is equal to or greater than the k-th critical grayscale value but lower than the (k+1)-th critical grayscale value and the position of the first pixel is the second position, the data generator may determine the k-th critical grayscale value as the first corrected image data. The first image data may range between a lower grayscale value and an upper grayscale value, the first critical grayscale value corresponding to the lower grayscale value.

In accordance with one or more other embodiments, a method for driving an organic light emitting display apparatus includes receiving first image data corresponding to a first pixel; determining a position of the first pixel; comparing the first image data with a first critical grayscale value; and when the first image data ranges between a lower grayscale value and the first critical grayscale value, setting one of the lower grayscale value or the first critical grayscale value as first corrected image data based on a dithering algorithm and the determined position of the first pixel, and when the first image data is greater than the first critical grayscale value but equal to or lower than an upper grayscale value, setting the first image data as the first corrected image data.

Determining the position of the first pixel may include storing a plurality of dithering patterns, each of the dithering patterns including data elements, each of the data elements having a first value or a second value, selecting one of the dithering patterns corresponding to the first image data, selecting one of the data elements of the selected dithering pattern corresponding to the position of the first pixel, determining the position of the first pixel as a first position when the selected data element has the first value, and determining the position of the first pixel as a second position when the selected data element has the second value The setting operation may include determining the first critical grayscale value as the first corrected image data when the first image data ranges between the lower grayscale value and the first critical grayscale value and the position of the first pixel is the first position, or determining the lower grayscale value as the first corrected image data when the first image data ranges between the lower grayscale value and first critical grayscale value and the position of the first pixel is the second position.

The method may include determining an order of an image frame including the first image data, wherein, when the first image data is between the lower grayscale value and the first critical grayscale value, the setting includes determining one of the lower grayscale value and the first critical grayscale value as the first corrected image data based on a dithering algorithm, the determined order of the image frame, and the determined position of the first pixel.

Determining the order of the image frame may include determining the order of the image frame as a first turn when the order of the image frame including the first image data is an odd number, and determining the order of the image frame as a second turn when the order of the image frame including the first image data is an even number.

Determining of the position of the first pixel may include storing first and second pattern sets, each of the first and second pattern sets including a plurality of dithering patterns, each of the dithering patterns including data elements, each of the data elements having a first value or a second value, selecting the first pattern set when the order of the image frame is the first turn or the second pattern set when the order of the image frame is the second turn, selecting one of the dithering patterns of the selected pattern set that corresponds to the first image data, selecting one of the data elements of the selected dithering pattern corresponding to the position of the first pixel, determining the position of the first pixel as the first position when the selected data element has the first value, and determining the position of the first pixel as the second position when the selected data element has the second value, The setting operation may include determining the first critical grayscale value as the first corrected image data when the first image data ranges between the lower grayscale value and the first critical grayscale value and the position of the first pixel is the first position, or determining the lower grayscale value as the first corrected image data when the first image data ranges between the lower grayscale value and the first critical grayscale value and the position of the first pixel is the second position.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
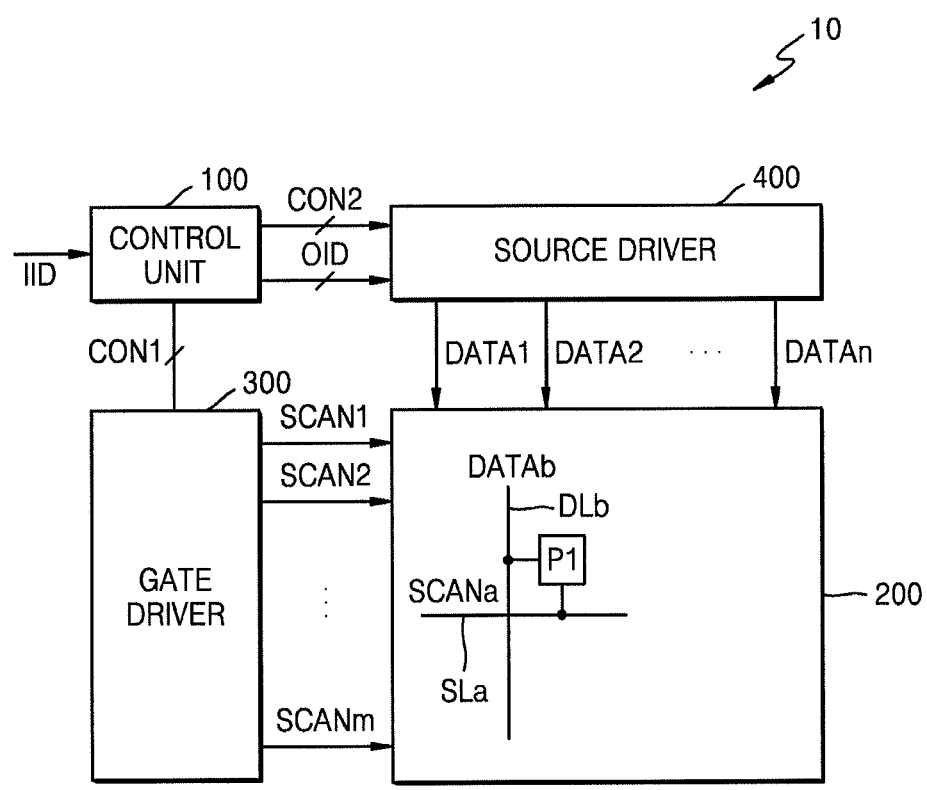
FIG. 1 illustrates an embodiment of an organic light emitting display apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

FIG. 1 illustrates an embodiment of an organic light emitting display apparatus 10 which includes a control unit 100, a display unit 200, a gate driver 300, and a source driver 400. The control unit 100, the gate driver 300, and the source driver 400 may be respectively formed on separate semiconductor chips or may be integrated on a single semiconductor chip. In addition, the control unit 100, the gate driver 300, and/or the source driver 400 may be on the same substrate on which the display unit 200 is formed.

The organic light emitting display apparatus 10 displays images based on light emitted from pixels P. The organic light emitting display apparatus 10 may be an electronic apparatus such as a smartphone, a personal computer (PC), a laptop PC, a monitor, a TV, or another device. Also, the organic light emitting display apparatus 10 may be an image display component of such an electronic apparatus.

The organic light emitting display apparatus 10 receives image frames, for example, from an external source. The image frames may be sequentially displayed to present form a moving image. Each image frame may include input image data IID which includes information corresponding to the luminance of light to be emitted from the pixels P. The number of bits of the input image data IID may be determined according to given luminance levels.

For example, the input image data IID may be an 8-bit digital signal to display a grayscale range of 256 luminance levels. In this case, the darkest value may correspond to a first level and the brightest value may correspond to a $256^{th}$ level. Thus, the input image data IID corresponding the first level may be 0, and input image data IID corresponding to the 256th level may be 255. The darkest value of the grayscale range may be referred to as a minimal grayscale value, and the brightest value may be referred to as a maximal grayscale value. The number of luminance values may be 64, 1024, or another range of levels in another embodiment.

The control unit 100 is connected to the display unit 200, the gate driver 300, and the source driver 400. The control unit 100 receives input image data IID and outputs first control signals CON1 to the gate driver 300. The first control signals CON1 may include a vertical synchronization signal VSYNC. In one embodiment, the first control signals CON1 may include control signals to be used by the gate driver 300 to output scan signals SCAN1 TO SCANm synchronized with the vertical synchronization signal VSYNC. The control unit 100 outputs second control signals CON2 to the source driver 400.

The control unit 100 generates output image data OID to the source driver 400. The second control signals CON2 include control signals to be used by the source driver 400 to output data signals DATA1 to DATAn corresponding to the output image data OID. The output image data OID may include image information to be used for generating the data signals DATA1 to DATAn. The output image data OID may be obtained by correcting the input image data IID received from an external device.

The display unit 200 includes a plurality of pixels P, a plurality of scan lines each connected to pixels P of a row of the pixels P, and a plurality of data lines connected to pixels P of a column of pixels. For example, in FIG. 1, the display unit 200 includes a first pixel P1, a first scan line SCANa connected to all pixels P of a row in which the first pixel P1 is included, and a first data line DATAb connected to all pixels P of a column in which the first pixel P1 is included.

The first pixel P1 includes a pixel circuit that receives power to control a driving current and an organic light emitting diode for emitting light with a luminance level corresponding to the driving current. The pixel circuit outputs the driving current based on a power voltage and a data signal. The driving current is output to the anode of an organic light emitting diode. The organic light emitting diode emits light corresponding to a current flowing between the anode and its cathode.

The gate driver 300 outputs the scan signals SCAN1 to SCANm to the scan lines, for example, in synchronization with the vertical synchronization signal VSYNC.

The source driver 400 outputs the data signals DATA1 to DATAn to the data lines in synchronization with the scan signals SCAN1 TO SCANm. The source driver 400 outputs the data signals DATA1 to DATAn in proportion to image data from the data lines.

An embodiment of a method for generating output image data OID from input image data IID using the control unit 100 will now be described.

Figure 2:
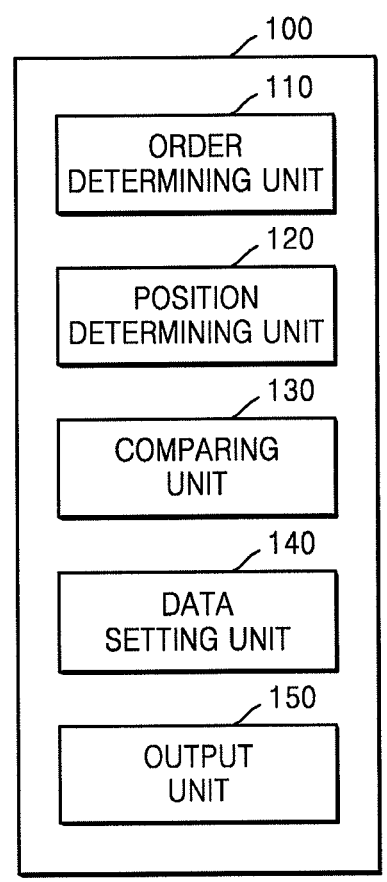
FIG. 2 illustrates an embodiment of a control unit.

FIG. 2 illustrates an embodiment of the control unit 100. Referring to FIG. 2, the control unit 100 includes an order determining unit 110, a position determining unit 120, a comparing unit 130, a data setting unit 140, and an output unit 150.

The order determining unit 110 determines the order of image frames, each of which includes input image data IID received, for example, from an external source. For example, the order of an odd numbered image frame received from the external source may be determined as a first turn by the order determining unit 110, and the order of an even numbered image frame of the plurality of image frames may be determined as a second turn by the order determining unit 110.

The position determining unit 120 may determine the position of the first pixel P1 in the display unit 200. For example, the position determining unit 120 may store a plurality of dithering patterns containing data elements, each having a first value or a second value. If the input image data IID received from an external device and corresponding to the first pixel P1 is referred to as first image data, the position determining unit 120 may select one of the dithering patterns corresponding to the first image data. The position determining unit 120 may select one of the dithering patterns, for example, in consideration of or regardless of an order defined by the order determining unit 110.

Thereafter, the position determining unit 120 may select one of the data elements of the selected dithering pattern that corresponds to the position of the first pixel P1. If the selected data element has the first value, the position determining unit 120 may determine the position of the first pixel P1 as a first position. If the selected data element is the second value, the position determining unit 120 may determine the position of the first pixel P1 as a second position.

The comparing unit 130 compares the first image data with a first critical grayscale value and a second critical grayscale value. Output image data OID corresponding to the first pixel P1 may be referred to as first corrected image data. The data setting unit 140 may generate the first corrected data from the first image data based on results of the comparison. The comparing unit 130 may compare the first image data with first to nth critical grayscale values TH1 to THn. In this case, the data setting unit 140 may generate the first corrected image data from the first image data based on results of the comparison by the comparing unit 130.

The first critical grayscale value may be equal to a lower (e.g., the minimal) grayscale value. In this case, the comparing unit 130 may omit a procedure of comparing the first image data with the first critical grayscale value. For example since the first image data is always equal to or greater than the minimal grayscale value, it may not necessary to compare the first image data with the first critical grayscale value. The following description will be presented under the assumption that the first critical grayscale value is equal to the lower grayscale value. The first critical grayscale value may correspond to another grayscale value in a predetermined range of grayscale values in another embodiment. The output unit 150 outputs the first corrected image data to the source driver 400.

Figure 3:
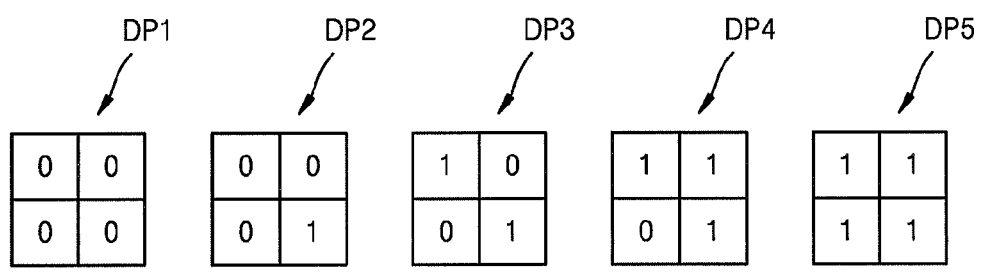
FIG. 3 illustrates examples of dithering patterns.

FIG. 3 illustrates examples of dithering patterns including first to fifth dithering patterns DP1 to DP5. In these examples, the first to fifth dithering patterns DP1 to DP5 are 2×2 data matrixes. The first to fifth dithering patterns DP1 to DP5 include data elements having at least one of a first value or a second value. In FIG. 3, the first value is and the second value is 0.

The first dithering pattern DP1 has four data elements equal to the second value. The second dithering pattern DP2 has one data element equal to the first value and three data elements equal to the second value. The third dithering pattern DP3 has two data elements equal to the first value and two data elements equal to the second value. The fourth dithering pattern DP4 has three data elements equal to the first value and one data element equal to the second value. The fifth dithering pattern DP5 has four data elements equal to the first value.

The position determining unit 120 select one of the first to fifth dithering patterns DP1 to DP5 based on the value of first image data. For example, the position determining unit 120 may select the first dithering pattern DP1 when the first image data is 0. The position determining unit 120 may select the second dithering pattern DP2 when the first image data is 1. The position determining unit 120 may select the third dithering pattern DP3 when the first image data is 2. The position determining unit 120 may select the fourth dithering pattern DP4 when the first image data is 3. The position determining unit 120 may select the fifth dithering pattern DP5 when the first image data is 4. The dithering patterns may be stored in a memory of the control unit 100 in the form of a look-up table. The position determining unit 120 may select a dithering pattern corresponding to the first image data from the look-up table.

In FIG. 3, the dithering patterns are 2×2 data matrixes. The dithering patterns may correspond to matrixes of different sizes in another embodiment. Also, in FIG. 3, five dithering patterns are illustrated. However, a different number of dithering patterns may be used in another embodiment. For example, in one embodiment, the number of dithering patterns may be equal to the number of grayscale values counted from a lower (e.g., minimal) grayscale value to the first critical grayscale value TH1.

Figure 4:
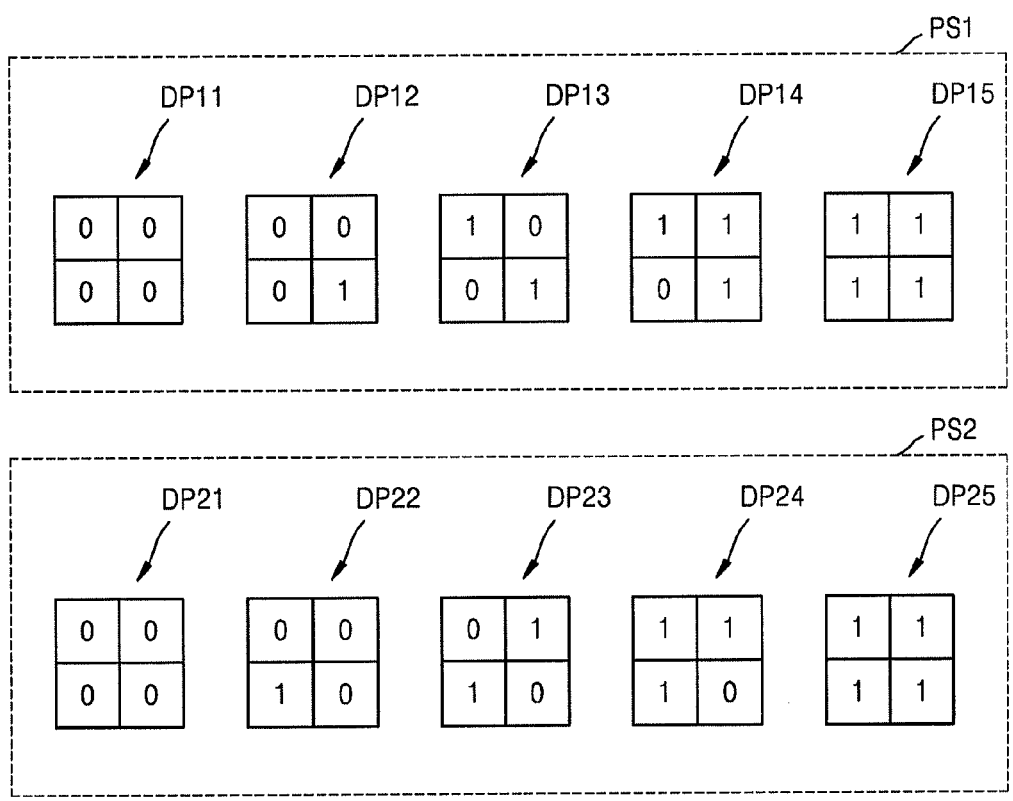
FIG. 4 illustrates more examples of dithering patterns.

FIG. 4 illustrates other examples of dithering patterns which five dithering patterns DP11 to DP15 grouped in a first pattern set, and five dithering patterns DP21 to DP25 grouped in a second pattern set. The dithering patterns DP11 to DP15 and dithering patterns DP21 to DP25 may be 2×2 data matrixes. The dithering patterns DP11 to DP15 and the dithering patterns DP21 to DP25 may include data having at least one of a first value or a second value. In FIG. 4, the first value is 1 and the second value is 0.

For example, each of the dithering patterns DP11 and DP21 has four data elements equal to the second value. Each of the dithering patterns DP12 and DP22 has one data element equal to the first value and three data elements equal to the second value. Each of the dithering patterns DP13 and DP23 has two data elements equal to the first value and two data elements equal to the second value. Each of the dithering patterns DP14 and DP24 has three data elements equal to the first value and one data element equal to the second value. Each of the dithering patterns DP15 and DP25 has four data elements equal to the first value.

Each of the dithering patterns of the first pattern set may have a different data element arrangement compared to the data element arrangement of a corresponding one of the dithering patterns of the second pattern set. For example, in the dithering pattern DP13 corresponding to the dithering pattern DP23, a left-upper data element and a right-lower data element may have the first value, and a right-upper data element and a left-lower data element may have the second value. However, in the dithering pattern DP23, a left-upper data element and a right-lower may have the second value, and a right-upper data element and a left-lower data element may have the second value.

The order determining unit 110 may determine the order of an image frame as a first turn or a second turn according to the order of the image frame including first image data. For example, the order of an odd-numbered image frame of a plurality of image frames received from an external device may be determined as a first turn by the order determining unit 110, and the order of an even-numbered image frame of the plurality of image frames may be determined as a second turn by the order determining unit 110.

The position determining unit 120 may select one of the dithering patterns DP11 to DP15 or the dithering patterns DP21 to DP25 based on the order of the image frames determined by the position determining unit 120 and the value of the first image data. For example, if the first image data is 0, the position determining unit 120 may select one of the dithering pattern DP11 or the dithering pattern DP21. If the first image data is 1, the position determining unit 120 may select one of the dithering pattern DP12 or the dithering pattern DP22. If the first image data is 2, the position determining unit 120 may select one of the dithering pattern DP13 or the dithering pattern DP23. If the first image data is 3, the position determining unit 120 may select one of the dithering pattern DP14 or the second-fourth dithering pattern DP24. If the first image data is 4, the position determining unit 120 may select one of the dithering pattern DP15 or the second-fifth dithering pattern DP25.

In addition, if the order of an image frame is determined as a first turn, the position determining unit 120 may select a dithering pattern in the first pattern set. If the order of the image frame is determined as a second turn, the position determining unit 120 may select a dithering pattern in the second pattern set. The dithering patterns may be stored in a memory of the control unit 100, for example, in the form of a look-up table. The position determining unit 120 may select a dithering pattern corresponding to the first image data from the look-up table.

In FIG. 4, the dithering patterns are 2×2 data matrixes. However, the dithering patterns may be matrixes of a different size in another embodiment. Also, in FIG. 4, five dithering patterns are in each pattern set. However, each pattern may have a different number of dithering patterns in another embodiment. For example, each pattern may have a number of dithering patterns equal to the number of grayscale levels counted from a lower (e.g., minimal) grayscale value to a first critical grayscale value TH1. Also, in FIG. 4, two pattern sets are illustrated. However, a different number of pattern sets (e.g., greater than two) may be included in another embodiment. For example, the number of pattern sets may be determined according to a time-based dithering algorithm to be used.

Figure 5:
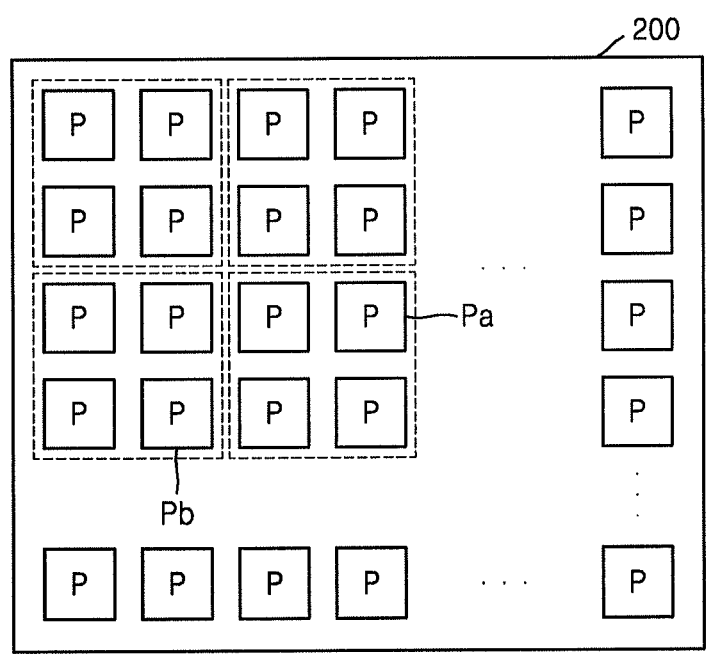
FIG. 5 illustrates an embodiment of a method for dividing pixel positions

FIG. 5 illustrates an embodiment of a method for determining pixel positions. Referring to FIG. 5, the position determining unit 120 divides all the pixels P of the display unit 200 using masks of a predetermined size. The predetermined size may be, for example, the same size as the size of dithering patterns. For example, as shown in FIG. 5, when dithering patterns are 2×2 data matrixes, the position determining unit 120 may divide all the pixels P of the display unit 200 using 2x2 masks, each containing two pixels P in a row and two pixels P in a column.

Thereafter, the position determining unit 120 selects one of data elements of a selected dithering pattern that corresponds to the position of the first pixel P1 using a mask. For example, the position determining unit 120 selects one of data elements of the selected dithering pattern that corresponds to the position of the first pixel P1 on a mask containing the first pixel P1.

For example, the case where the position determining unit 120 does not consider an order determined by the order determining unit 110 and a-th image data corresponding to an a-th pixel Pa is 1 may be considered. In this case, since the a-th image data is 1, the position determining unit 120 selects the second dithering pattern DP2 from the dithering patterns DP1 to DP5. In addition, since the a-th pixel Pa is at a right-upper position in a mask, the second value, which is a right-upper data element of the dithering pattern DP2, may be selected by the position determining unit 120 as a data element corresponding to the position of the a-th pixel Pa.

In another example, the case where the position determining unit 120 considers an order determined as a first turn by the order determining unit 110 and b-th image data corresponding to a b-th pixel Pb is 3 may be considered. In this case, since the order determined by the order determining unit 110 is a first turn and the b-th image data is 3, the position determining unit 120 selects the dithering pattern DP14 from the dithering patterns DP11 to DP15 of the first pattern set. In addition, since the b-th pixel Pb is at a right-lower position in a mask, the first value which is a right-upper data element of the dithering pattern DP14 may be selected by the position determining unit 120 as a data element corresponding to the position of the b-th pixel Pb. In this manner, the position determining unit 120 determines the first value or the second value as a data element corresponding to the position of the first pixel P1.

Figure 6A:
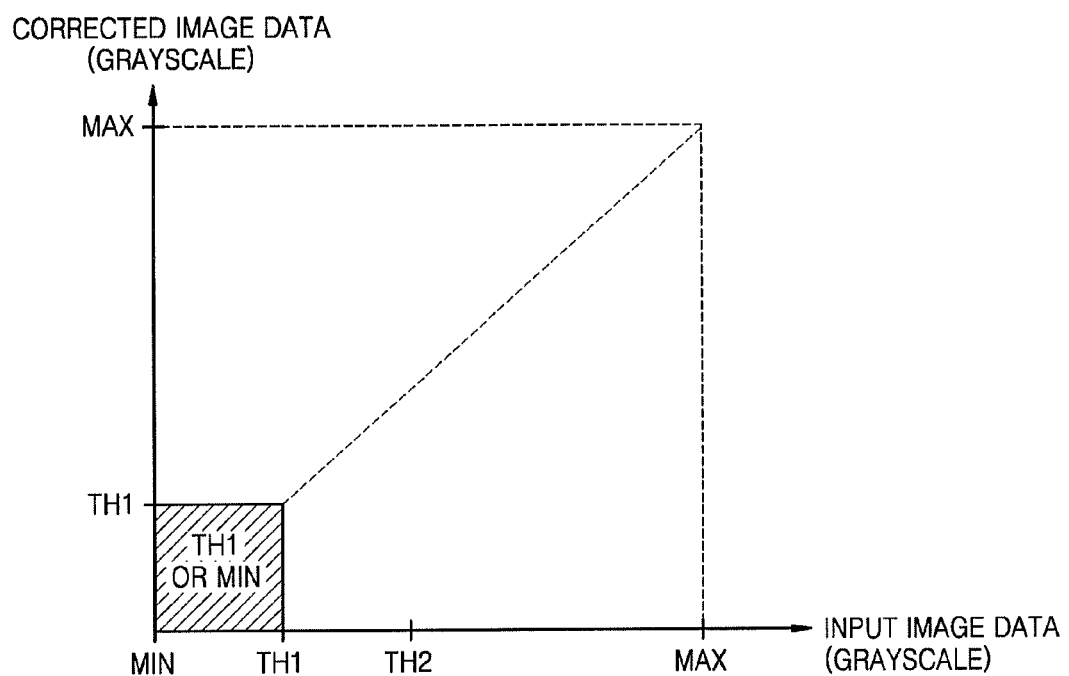
FIGS. 6A and 6B illustrate embodiments of a method for determining output image data.
Figure 6B:
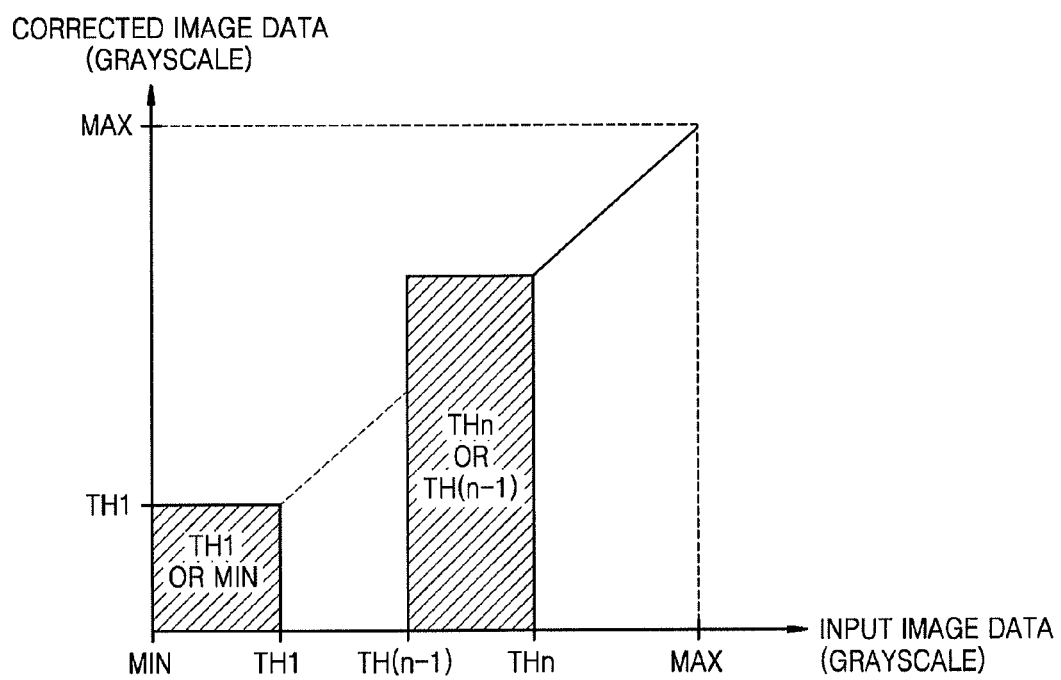

FIGS. 6A and 6B illustrate an embodiment of a method for determining output image data. Referring to FIGS. 6A and 6B, the method may be used to determine the grayscale of output image data OID according to the grayscale of input image data IID.

The comparing unit 130 compares first image data with a first critical grayscale value. In this case, the data setting unit 140 generates first corrected image data from the first image data based on results of the comparison by the comparing unit 130. For example, if the first image data is between a lower (e.g., minimal) grayscale value and a first critical grayscale value TH1 and a data element corresponding to the position of the first pixel P1 is the first value, the data setting unit 140 determines the first critical grayscale value TH1 as the first corrected image data.

If the first image data is between the lower grayscale value and the first critical grayscale value TH1 and the data element corresponding to the position of the first pixel P1 is the second value, the data setting unit 140 may determine the lower grayscale value as the first corrected image data.

If the first image data is greater than the first critical grayscale value TH1 but equal to or lower than a second critical grayscale value, the first image data may be determined as the first corrected image data.

The first critical grayscale value TH1 may be a reference value for determining a low grayscale. If a low grayscale image is displayed on the organic light emitting display apparatus 10, the intensity of light emitted from the organic light emitting diodes of the organic light emitting display apparatus 10 may be markedly varied, even by a small current difference between the organic light emitting diode. As a result, it may be difficult to control such a small current difference.

Therefore, when a grayscale is lower than the first critical grayscale value TH1, only one of a current value corresponding to the first critical grayscale value TH1 or a current value corresponding to the lower (e.g., minimal) grayscale value may be used, and the grayscale may be expressed by a dithering algorithm in order to reduce low grayscale stains. However, since a grayscale higher than the first critical grayscale value TH1 may not cause problems related with controlling a small amount of current, the grayscale may be expressed without using a dithering algorithm.

The comparing unit 130 compares the first image data with first to n-th critical grayscale values TH1 to THn. In this case, the data setting unit 140 generates first corrected image data from the first image data based on results of the comparison by the comparing unit 130.

For example, if the first image data is between the minimal grayscale value and the first critical grayscale value TH1 and a data element corresponding to the position of the first pixel P1 is the first value, the data setting unit 140 may determine the first critical grayscale value TH1 as or based on the first corrected image data.

If the first image data is between the minimal grayscale value and the first critical grayscale value TH1 and the data element corresponding to the position of the first pixel P1 is the second value, the data setting unit 140 may determine the minimal critical grayscale value as the first corrected image data.

If the first image data is greater than a kth critical grayscale value THk but equal to or lower than a (k+1)th critical grayscale value TH(k+1), and a data element corresponding to the position of the first pixel P1 is the first value, the data setting unit 140 may determine the (k+1)th critical grayscale value TH(k+1) as the first corrected image data.

If the first image data is greater than a kth critical grayscale value THk but equal to or lower than a (k+1)th critical grayscale value TH(k+1), and the data element corresponding to the position of the first pixel P1 is the second value, the data setting unit 140 may determine the kth critical grayscale value THk as the first corrected image data.

If the first image data is greater than an nth critical grayscale value THn but equal to or lower than the maximal critical grayscale value, the first image data may be determined as the first corrected image data.

In this case, the THn critical grayscale value THn may be a reference value for determining a low gray scale. In addition, the first to (n−1)th critical grayscale values TH1 to TH(n−1) may be reference grayscale values for expressing a low grayscale. In this manner, low grayscale strains of the organic light emitting display apparatus 10 may be reduced, and a current difference caused by dithering may be reduced to reduce flickering during dithering.

Figure 7:
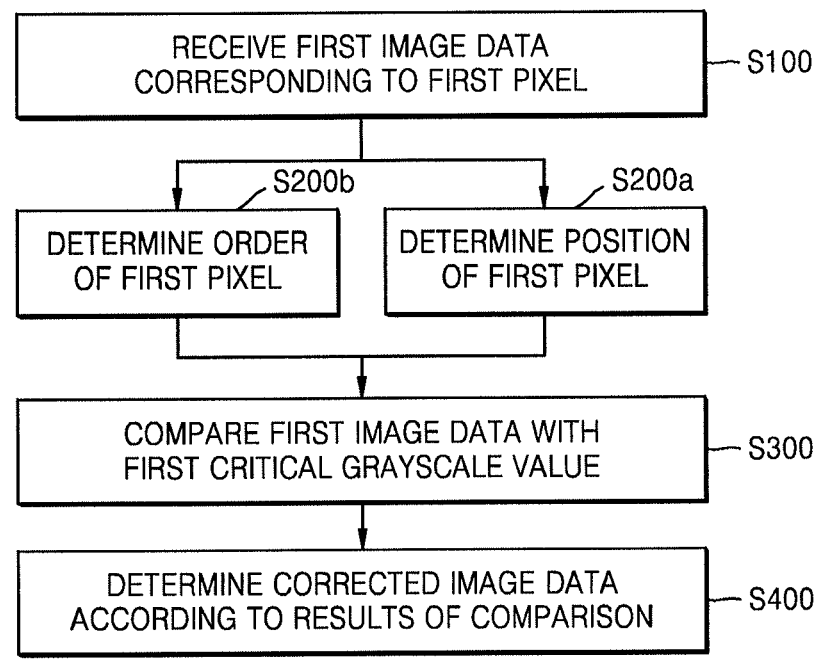
FIG. 7 illustrates an embodiment of a method for driving an organic light emitting display apparatus.

FIG. 7 illustrates an embodiment of a method for driving an organic light emitting display apparatus. Referring to FIG. 7, the method includes receiving first image data corresponding to a first pixel (S100). The position of the first pixel may be determined on a display unit (S200a), and the order of an image frame having input image data in which the first image data is included may be determined (S200b). Next, the first image data may be compared with a first critical grayscale value (S300). Then, corrected image data may be generated based on the determined position, the determined order, and results of the comparison (S400).

The control unit and/or its constituent elements may be implemented in logic which, for example, may include hardware, software, or both. When implemented at least partially in hardware, the control unit and/or its constituent elements may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the control unit and/or its constituent elements may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

By way of summation and review, in an organic light emitting display, images are generated based on light emitted from organic light emitting diodes. Each diode emits light based on the recombination of electrons and holes in an emission layer. The amount of light emitted varies based on an applied current. When a low grayscale image is displayed, low grayscale stains may form because it is difficult to finely control the current driving the diodes. This may be attributed, at least in part, by the sensitivity of the diodes in the low grayscale range. In accordance with one or more of the aforementioned embodiments, an organic light emitting display apparatus reduces or prevents low grayscale stains.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting display apparatus, comprising:
   a display including a first data line connected to a first pixel;
   a comparator to compare first image data of input image data to a first critical grayscale value and a second critical grayscale value, the first image data corresponding to the first pixel;
   a data generator to determine one of the first critical grayscale value or the second critical grayscale value as first corrected image data such that the first image data are dithered by using only the first critical grayscale value and the second critical grayscale value of the first corrected image data when the first image data is not less than the first critical grayscale value but not more than the second critical grayscale value;
   a source driver to output a data signal corresponding to input data to the first data line; and
   an output to output the first corrected image data to the source driver.

2. The apparatus as claimed in claim 1, wherein:
   the first image data ranges not less than a lowest grayscale value but not more than a highest grayscale value,
   the first critical grayscale value is the lowest grayscale value, and
   when the first image data is more than the second critical grayscale value, the data generator is to determine the first image data as the first corrected image data without correcting the first image data.

3. The apparatus as claimed in claim 1, further comprising:
   a position determiner to determine a position of the first pixel of the display, wherein, when the first image data is not less than the first critical grayscale value but not more than the second critical grayscale value, the data generator is to determine one of the first critical grayscale value or the second critical grayscale value as the first corrected image data based on a dithering algorithm and the determined position of the first pixel.

4. The apparatus as claimed in claim 3, wherein:
the position determiner is to determine the position of the first pixel as one of a first position or a second position,
when the first image data is not less than the first critical grayscale value but not more than the second critical grayscale value and the position of the first pixel is the first position, the data generator is to determine the second critical grayscale value as the first corrected image data, and
when the first image data is not less than the first critical grayscale value but not more than the second critical grayscale value and the position of the first pixel is the second position, the data generator is to determine the first critical grayscale value as the first corrected image data.

5. The apparatus as claimed in claim 4, wherein the position determiner is to:
store a plurality of dithering patterns, each of the dithering patterns having data elements, each of the data elements having a first value or a second value,
select one of the dithering patterns corresponding to the first image data,
select one of the data elements of the selected dithering pattern corresponding to the position of the first pixel,
determine the position of the first pixel as the first position when the selected data element has the first value, and
determine the position of the first pixel as the second position when the selected data element has the second value.

6. The apparatus as claimed in claim 3, further comprising:
an order determiner to determine an order of an image frame including the input image data, wherein:
when the first image data is not less than the first critical grayscale value but not more than the second critical grayscale value, the data generator is to determine one of the first critical grayscale value or the second critical grayscale value as the first corrected image data based on a dithering algorithm, the determined order of the image frame, and the determined position of the first pixel.

7. The apparatus as claimed in claim 6, wherein:
the position determiner is to determine the position of the first pixel as one of a first position or a second position based on the determined order of the image frame,
when the first image data is not less than the first critical grayscale value but not more than the second critical grayscale value and the position of the first pixel is the first position, the data generator is to determine the second critical grayscale value as the first corrected image data, and
when the first image data is not less than the first critical grayscale value but not more than the second critical grayscale value and the position of the first pixel is the second position, the data generator is to determine the first critical grayscale value as the first corrected image data.

8. The apparatus as claimed in claim 7, wherein:
when the order of the image frame including the input image data is an odd number, the order determiner is to determine the order of the image frame as a first turn,
when the order of the image frame including the input image data is an even number, the order determiner is to determine the order of the image frame as a second turn,
the position determiner is to store first and second pattern sets, each of the first and second pattern sets includes a plurality of dithering patterns, each of the dithering patterns including data elements, each data element having a first value or a second value, and
the position determiner is to:
select the first pattern set when the order of the image frame is the first turn or the second pattern set when the order of the image frame is the second turn,
select one of the dithering patterns of the selected pattern set that corresponds to the first image data,
select one of the data elements of the selected dithering pattern that corresponds to the position of the first pixel,
determine the position of the first pixel as the first position when the selected data element has the first value, and
determine the position of the first pixel as the second position when the selected data element has the second value.

9. The apparatus as claimed in claim 1, wherein:
the comparator is to compare the first image data with a third critical grayscale value, and
when the first image data is more than the second critical grayscale value but not more than the third critical grayscale value, the data generator is to determine one of the second critical grayscale value or the third critical grayscale value as the first corrected image data.

10. The apparatus as claimed in claim 9, wherein:
the first image data ranges not less than a lowest grayscale value but not more than a highest grayscale value,
the second critical grayscale value is greater than the lowest grayscale value, and
the third critical grayscale value is greater than the second critical grayscale value but not more than the highest grayscale value
when the first image data is more than the third critical grayscale value, the data generator is to determine the first image data as the first corrected image data without correcting the first image data.

11. The apparatus as claimed in claim 9, further comprising:
a position determiner to determine a position of the first pixel on the display, wherein:
when the first image data is more than the second critical grayscale value but not more than the third critical grayscale value, the data generator is to determine one of the second critical grayscale value or the third critical grayscale value as the first corrected image data based on a dithering algorithm and the determined position of the first pixel.

12. The apparatus as claimed in claim 11, wherein:
the position determiner is to determine the position of the first pixel as one of a first position or a second position,
when the first image data is more than the second critical grayscale value but not more than the third critical grayscale value and the position of the first pixel is the first position, the data generator is to determine the third critical grayscale value as the first corrected image data, and
when the first image data is more than the second critical grayscale value but not more than the third critical grayscale value and the position of the first pixel is the second position, the data generator is to determine the second critical grayscale value as the first corrected image data.

13. The apparatus as claimed in claim 11, further comprising:

an order determiner to determine an order of an image frame including the input image data, wherein:

when the first image data is more than the second critical grayscale value but not more than the third critical grayscale value, the data generator is to determine one of the second critical grayscale value or the third critical grayscale value as the first corrected image data based on a dithering algorithm, the determined order of the image frame, and the determined position of the first pixel.

14. The apparatus as claimed in claim 13, wherein:
the position determiner is to determines the position of the first pixel as one of a first position or a second position based on the determined order of the image frame, when the first image data is more than the second critical grayscale value but not more than the third critical grayscale value and the position of the first pixel is the first position, the data generator is to determine the third critical grayscale value as the first corrected image data, and when the first image data is more than the second critical grayscale value but not more than the third critical grayscale value and the position of the first pixel is the second position, the data generator is to determine the second critical grayscale value as the first corrected image data.

15. The apparatus as claimed in claim 1, wherein the first image data ranges not less than a lowest grayscale value but not more than a highest grayscale value, the first critical grayscale value is the lowest grayscale value, and
the second critical grayscale value is a reference value for determining a low grayscale value.

16. The apparatus as claimed in claim 1, wherein the first image data are dithered by using only a first current corresponding to the first critical grayscale value and a second current corresponding to the second critical grayscale value.

17. A method for driving an organic light emitting display apparatus, the method comprising:
receiving first image data corresponding to a first pixel;
determining a position of the first pixel;
comparing the first image data with a first critical grayscale value; and
when the first image data ranges not less than a lowest grayscale value but not more than the first critical grayscale value, setting one of the lowest grayscale value or the first critical grayscale value as first corrected image data such that the first image data are dithered by using only the lowest critical grayscale value and the first critical grayscale value of the first corrected image data based on a dithering algorithm and the determined position of the first pixel, and
when the first image data is greater than the first critical grayscale value but equal to or lower than a highest grayscale value, setting the first image data as the first corrected image data without correcting the first image data.

18. The method as claimed in claim 17, wherein:
determining the position of the first pixel includes:
storing a plurality of dithering patterns, each of the dithering patterns including data elements, each of the data elements having a first value or a second value,
selecting one of the dithering patterns corresponding to the first image data,
selecting one of the data elements of the selected dithering pattern corresponding to the position of the first pixel,
determining the position of the first pixel as a first position when the selected data element has the first value, and
determining the position of the first pixel as a second position when the selected data element has the second value,
the setting includes:
determining the first critical grayscale value as the first corrected image data when the first image data ranges not less than the lowest grayscale value but not more than the first critical grayscale value and the position of the first pixel is the first position, or
determining the lowest grayscale value as the first corrected image data when the first image data ranges not less than the lowest grayscale value but not more than first critical grayscale value and the position of the first pixel is the second position.

19. The method as claimed in claim 17, further comprising:
determining an order of an image frame including the first image data, wherein, when the first image data is not less than the lowest grayscale value but not more than the first critical grayscale value, the setting includes determining one of the lowest grayscale value or the first critical grayscale value as the first corrected image data based on a dithering algorithm, the determined order of the image frame, and the determined position of the first pixel.

20. The method as claimed in claim 19, wherein:
determining the order of the image frame includes:
determining the order of the image frame as a first turn when the order of the image frame including the first image data is an odd number, and
determining the order of the image frame as a second turn when the order of the image frame including the first image data is an even number,
determining of the position of the first pixel includes:
storing first and second pattern sets, each of the first and second pattern sets including a plurality of dithering patterns, each of the dithering patterns including data elements, each of the data elements having a first value or a second value,
selecting the first pattern set when the order of the image frame is the first turn or the second pattern set when the order of the image frame is the second turn, selecting one of the dithering patterns of the selected pattern set that corresponds to the first image data,
selecting one of the data elements of the selected dithering pattern corresponding to the position of the first pixel,
determining the position of the first pixel as the first position when the selected data element has the first value, and
determining the position of the first pixel as the second position when the selected data element has the second value,
the setting includes:
determining the first critical grayscale value as the first corrected image data when the first image data ranges not less than the lowest grayscale value but not more than the first critical grayscale value and the position of the first pixel is the first position, or
determining the lowest grayscale value as the first corrected image data when the first image data ranges not less than the lowest grayscale value but not more than the first critical grayscale value and the position of the first pixel is the second position.

* * * * *